US009450165B1

(12) United States Patent
Taylor

(10) Patent No.: US 9,450,165 B1
(45) Date of Patent: Sep. 20, 2016

(54) APPARATUS AND METHOD FOR PRODUCTION OF UNTWINNED YBCO FILMS

(71) Applicant: Benjamin J. Taylor, Escondido, CA (US)

(72) Inventor: Benjamin J. Taylor, Escondido, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/557,147

(22) Filed: Dec. 1, 2014

Related U.S. Application Data

(63) Continuation-in-part of application No. 13/901,351, filed on May 23, 2013, now Pat. No. 9,188,514.

(51) Int. Cl.
*H01L 39/24* (2006.01)
*H01L 39/22* (2006.01)
*H01L 39/12* (2006.01)

(52) U.S. Cl.
CPC ......... *H01L 39/2496* (2013.01); *H01L 39/126* (2013.01); *H01L 39/225* (2013.01); *H01L 39/2454* (2013.01); *H01L 39/2464* (2013.01)

(58) Field of Classification Search
USPC ..................... 427/62, 171; 29/599
See application file for complete search history.

(56) References Cited

U.S. PATENT DOCUMENTS

| | | | | | |
|---|---|---|---|---|---|
| 2,527,636 | A | * | 10/1950 | Holden | ........ H01L 41/253 117/200 |
| 5,308,801 | A | * | 5/1994 | Cocks | ........ C04B 35/45 427/62 |
| 6,153,561 | A | * | 11/2000 | Sandhage | ........ C04B 41/4519 505/480 |

FOREIGN PATENT DOCUMENTS

EP 1465264 * 10/2004

OTHER PUBLICATIONS

Nam et al., "Detwinning YBa2Cu3O7-x Thin Films", Applied Physics Letters, vol. 82, pp. 3728-3730 (2003).
Dekkers et al., "Monocrystalline YBa2Cu3O7-x Thin Films on Vicinal SrTiO3(001) Substrates", Applied Physics Letters, vol. 83, pp. 5199-5201 (2003).
Kirtley et al., "Angle-Resolved Phase-Sensitive Determination of the In-Plane Gap symmetry in YBa2Cu3O7-x", Nature Physics, vol. 2, pp. 190-194 (2006).
Welp et al., "The Upper Critical Field of Untwinned YBa2Cu3O7-x Crystals", Physica C, vol. 161, pp. 1-5 (1989).
Welp et al., "Effect of Uniaxial Stress on the Superconducting Transition on YBa2Cu3O7", Physical Review Letters, vol. 69, No. 14, pp. 2130-2133 (1992).

(Continued)

*Primary Examiner* — Brian K Talbot
(74) *Attorney, Agent, or Firm* — SSC Pacific Patent Office; Arthur K. Samora; Kyle Eppele

(57) ABSTRACT

A method for manufacturing untwinned YBCO film can include the initial the step of depositing YBCO film on a substrate having a first end and second end. A temperature gradient can be established from the first end to the second end, which can establish an oxygen gradient in the YBCO film. A uniaxial pressure can further be established the film, in the same direction as the temperature gradient, form the first end to the second end. When the uniaxial pressure is established simultaneously with the temperature gradient, the result can be an untwinned YBCO film.

8 Claims, 6 Drawing Sheets

(56) References Cited

OTHER PUBLICATIONS

Pahlke et al., "Dynamic Variation of Biaxial Strain in Optimally doped and Underdoped YBa2Cu3O7-x Thin Films", Journal of Applied Physics, vol. 113, pp. 123907-1 to 123907-6 (2013).
Fietz et al., "Influence of Intrinsic Strain on Tc and Critical Current of High-Tc Superconductors", Superconductor Science and Technology, vol. 18, pp. S332-S337 (2005).
Cao et al., "The Effect of Epitaxial Strain on RBa2Cu3O7 Thin Films and the Perovskite Substrate", Physica C, vol. 337, pp. 24-30 (2000).
Lindemer et al., "Experimental and Thermodynamic Study of Nonstoichiometry in (YBa2Cu3O7-x)" Journal of American Ceramics Society, vol. 72, pp. 1775-1788 (1989).
Kim et al., "Growth Mechanism of YBa2Cu3O7-x Think Films and Precipitates on PLanar and Vicinal SrTiO3 Substrates", Journal of Material Research, vol. 15, pp. 596-612 (2000).
Ando et al., "Electrical Resistivity Anisotropy From Self-Organized One Dimensionality in High-Temperature Superconductors", Physical Review Letters, vol. 88, No. 13, pp. 137005-1-137005-4 (2002).
Liang et al., "Evaluation of CuO2 Plane Hole Doping in YBa2Cu3O6+x Single Crystals", Physical Review B, vol. 73, pp. 180505(4) (2006).
Kivelson et al., "How to Detect Fluctuating Stripes in the High-Temperature Superconductors", Reviews of Modern Physics, vol. 75, p. 1201-1242 (2003).
Brotz et al., Controlled Modification of Interfacial Strain and Twinning in YBa2Cu3O7-x Films on Vicinal SrTio3 (001), Physical Review B, vol. 57, No. 6, pp. 3679-3682 (1998).
Taylor et al., "Identification of Two Critical Charge Carrier Doping Values in High-Temperature Y0.8Ca0.2Ba2Cu3Ox and Sm2-xCexCuO4-y Cuprate Superconductors", Physical Review B, vol. 81, pp. 174511-1 to 174511-8 (2010).
Sonier et al., "Hole-Doping Dependence of the Magnetic Penetration Depth and Vortex Core Size in YBa2Cu3Oy: Evidence for Stripe Correlations Near 1/8 Hole Doping", Physical Review B, vol. 76, pp. 134518-1 to 134518-11 (2007).
Taylor et al., "Investigation of the effects of Oxygen Content in Yba2Cu3Ox on the Depth and Profile of Direct Ion Trenches", SPAWAR Systems Center Pacific Technical Report 2014 (Sep. 2014), pp. 1-8.

* cited by examiner

APPARATUS AND METHOD FOR PRODUCTION OF UNTWINNED YBCO FILMS

CROSS-REFERENCE TO RELATED APPLICATIONS

This application is a continuation-in-part of U.S. application Ser. No. 13/901,351, filed May 23, 2013, and entitled "Apparatus And Method For Producing A Sample Having A Monotonic Doping Gradient Of A Diffusive Constituent Or Interstitial Atom Or Molecule". The '351 application is hereby incorporated by reference herein in its entirety.

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil, referencing NC 103086.

FIELD OF THE INVENTION

The present invention pertains generally to an apparatus and method for producing large, uniform films of $YBa_2Cu_3O_{7-x}$ (YBCO) that are free from micro-scale defects commonly known as a-b axis twins. More particularly, the present invention pertains to an apparatus and method for producing large YBCO films, wherein the removal of the twins can result in films with discernable anisotropic electronic transport properties. The invention can be particularly, but not exclusively, useful as an apparatus and method for producing large YBCO films, which can reduce quantum mechanically driven electronic noise when the YBCO films are incorporated into Josephson Junctions.

BACKGROUND OF THE INVENTION

The compound $YBa_2Cu_3O_{7-x}$ (YBCO) is presently one of only a few materials with significant potential for use in high-$T_c$ superconducting (HTS) technological applications. The level of oxygen content determines the charge (hole) doping level in the compound and subsequently its electronic properties, including the critical temperature $T_c$, or the temperature at which the sample becomes superconducting. The temperature and partial oxygen pressure at which the sample is annealed determines the oxygen content of the sample.

In addition to the oxygen content, the electronic transport properties of epitaxial films of YBCO are influenced in large part by the YBCO structural properties—the YBCO defects, crystalline phases, and surface morphology—all of which can be inherently influenced by the deposition conditions and substrate properties. With respect to the substrate properties, the extent to which the lattice of the substrate matches that of YBCO strongly determines the quality of a thin film. However, due to the lack of a perfectly matched substrate, YBCO is commonly grown on various lattice-mismatched materials. But, even a lattice mismatch of no more than a few percent is sufficient to produce substantial stress in the film. This stress in the YBCO film can often be relieved by the formation of defects in the film.

As the film is cooled from its growth temperature, which can be typically between 700° C. to 850° C., additional stress in the film can be induced due to differing thermal expansion coefficients between the film and the substrate. During this cooling process YBCO also undergoes a structural phase transition from the tetragonal to orthorhombic phase. The restructuring of the YBCO lattice induces stress that is most effectively relieved by the formation of a-axis and b-axis domains that are separated by twin boundaries. This phenomenon can commonly be referred to as "twinning".

The dimensions of the twin structures in films can vary considerably, with widths ranging from ~50 nm to 800 nm, and lengths as long as 2 μm. The presence of the twin structures has the effect that bulk electronic transport measurements are effectively an average of the a-axis and b-axis conductivities. For most applications, this is not a major design consideration. However, in the case of micro/nano-scale structures, electronic transport properties become dependent on the locally dominant domain alignment, particularly in the case of quantum tunneling through a Josephson Junction. Therefore, for Josephson Junction applications, twinning can be an undesirable effect.

Single crystals of YBCO have been de-twinned under the simultaneous application of heat and uniaxial stress. This approach, however, has proved futile in thin films except for the special cases where a small portion of the film has been suspended above the underlying substrate. Mostly twin-free films have been grown on vicinal $SrTiO_3$ substrates. However, a reduction of the superconducting critical temperature, $T_c$, has been observed for these films in addition to a dependence on variations of the local vicinal angle to the formation of other types of defects. Furthermore, a process to produce large numbers of Josephson Junctions in a single circuit with a film grown on vicinal cut substrates has yet to be demonstrated.

In view of the above, it is an object of the present invention to provide a YBCO film and methods for manufacture that allow for a manufacture of a YBCO film substantially without twinning. Another object of the present invention is to provide a YBCO film and methods for manufacture that result in an untwinned YBCO film, but without reducing $T_c$. Still another object of the present invention to provide a large scale YBCO film and methods of manufacture, which result in a YBCO film having sufficient crystallinity that the YBCO film can be used for Josephson Junctions with controlled tunneling direction in the a-b plane to exploit the anisotropic d-wave symmetry of the superconducting order parameter. Another object of the present invention to provide a YBCO film and methods for manufacture which can be easy to implement in a cost-effective manner.

SUMMARY OF THE INVENTION

A method for manufacturing untwinned YBCO film, and apparatus for accomplishing the methods, can include the initial the step of depositing a YBCO film on a substrate. The substrate (and deposited YBCO film having an initial uniform oxygen content) can have a first end and second end. The YBCO film and substrate can undergo an annealing process using a first temperature at the first end and a second temperature that is higher than the first temperature at the said second end. The first and second temperature can be established by a respective first and second heat source, heat sink and the like. The temperature difference can establish a temperature gradient in the film, which can further establish an oxygen gradient in the film from the first end to the second end.

The methods and apparatus can further include a means for establishing a uniaxial pressure on said film from said first end to said second end, which can occur simultaneously establishment of the temperature gradient. This uniaxial pressure can be established by placing a force on the first end and/or second end of the substrate. When the uniaxial pressure is established simultaneously with the annealing step, the result can be an untwinned YBCO film. In some embodiments, it may be desirable to manufacture an untwinned YBCO film, but with uniform oxygen content across the length of the film. For these embodiments, the methods can further include the steps of raising said first temperature to substantially equal said second temperature to establish a uniform film temperature for said YBCO film. The raising step can be accomplished after the establishment of the initial oxygen gradient, while the substrate and film are still under uniaxial pressure. Next, the first and second temperature (which are now substantially equal), can be slowly removed to ambient temperature. Once at ambient temperature, the uniaxial pressure can be removed.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

The apparatus and annealing method described herein can be designed for producing an epitaxial c-axis oriented $YBa_2Cu_3O_{7-x}$ (YBCO) film also having uniform a-axis and b-axis ordering, i.e, a mono-crystalline film that is free of the stress induced growth defects involving the formation of a-axis and b-axis domains that are separated by twin boundaries, commonly referred to as twinning. Advanced systems that can be fabricated using such YBCO thin films can include, but are not limited to, circuits having Josephson Junctions. Josephson Junctions can require high-quality thin films of YBCO with well-controlled electronic transport properties.

With respect to Josephson Junctions, the $I_c R_N$ product (i.e., the product of critical current and normal resistance for a Josephson Junction) can be used as an indicator for a figure-of-merit for the quality of Josephson Junctions. A commonly observed complication in forming large numbers of Josephson Junctions on a film is an up to thirty percent (30%) spread in the $I_c R_N$ value due to variation in tunneling dynamics (manufacturing defect). This variation introduces electronic noise into the transport process, and it also critically impacts the linearity, gain and sensitivity performance of systems such as Superconducting Quantum Interference Apparatus (SQUID) arrays. The apparatus of and methods of the present invention can overcome this limitation. This can further allow for the development of HTS systems that are based on YBCO thin films, such as passive microwave systems, superconducting transistors, and circuitry based on Josephson junctions, or any other application which can require high-quality, untwinned thin films of YBCO with smooth surfaces for optimal performance.

Figure 1:
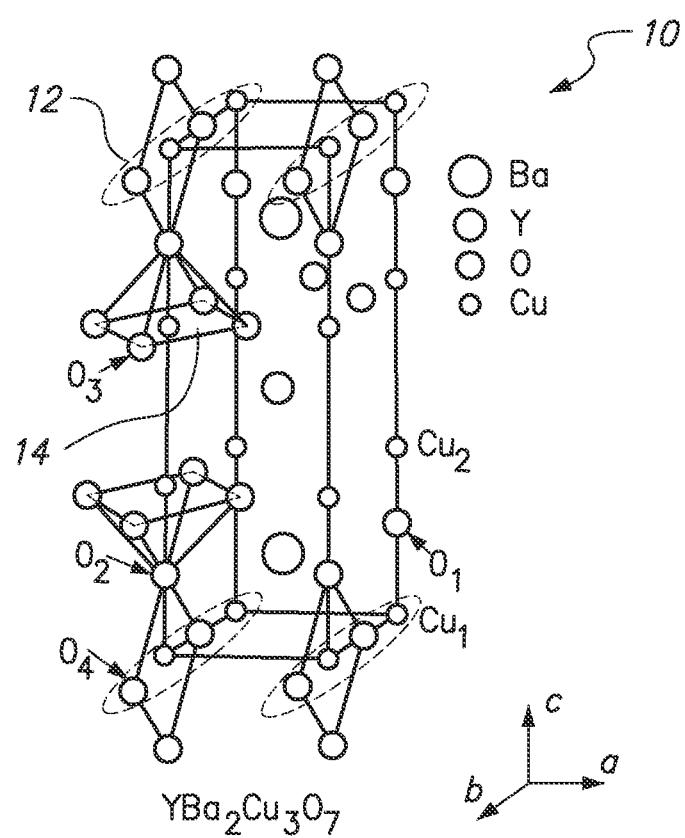
FIG. 1 is a depiction of a lattice structure of a fully oxygenated $YBa_2Cu_3O_7$ molecule as known in the prior art, with defined a-, b- and c-axes.

FIG. 1 can be a prior art depiction of the lattice structure of a fully oxygenated YBCO molecule (unit cell) 10. When twinning occurs, there are two possible alignments of the twin structures in the a-b plane. The unit cells within a twin structure are aligned, but there exists a nearly 90 degree rotation of the unit cell between the two twinning directions. As shown in FIG. 1, YBCO has two different Cu sites, the Cu(1) chain site 12, and the Cu(2) plane site 14. The Cu(1) O chain sites 12 are known to order along the b-axis direction. It has also been established in the prior art that, in the region of optimal oxygen doping (7-x≈6.93), uniaxial pressure along the a-axis (b-axis) suppresses (enhances) the value of $T_c$. The opposing effects of applied pressure along the a- and b-axes on $T_c$ are nearly equal, though most studies in the prior art can indicate that $|dT_c/dp_a|<|dT_c/dp_b|$.

The effect of uniaxial pressure along the a-axis (b-axis) has not been extensively studied for other oxygen doping levels, however, in-plane biaxial compression ($\Delta p_{ab}$) has been examined for hole doping levels spanning the entire superconducting phase from p≈0.6 to p≈0.20. From the prior art, it can be seen that $\Delta T_c/\Delta p_{ab}$ increases as the compound is reduced from an optimal oxygen doping level, from an initial (positive) value and reaching a maximum in the region 0.1<p<0.125.

Through the application of uniaxial pressure to the substrate upon which a film of over-doped YBCO (YBCO having an oxygen content close to $O_7$) has been deposited under unique thermal and atmospheric conditions, a high level of crystalline order in the a-b plane (i.e., in the direction of the a-axis and b-axes in FIG. 1) may be induced. This can result in untwinned YBCO film with the c-axis oriented perpendicular to the a-b plane (as used herein, the terms "untwinned" and "detwinned" can be used interchangeably, and can be taken to mean that same thing). The manner in which this can be accomplished is discussed more fully below.

Figure 2:
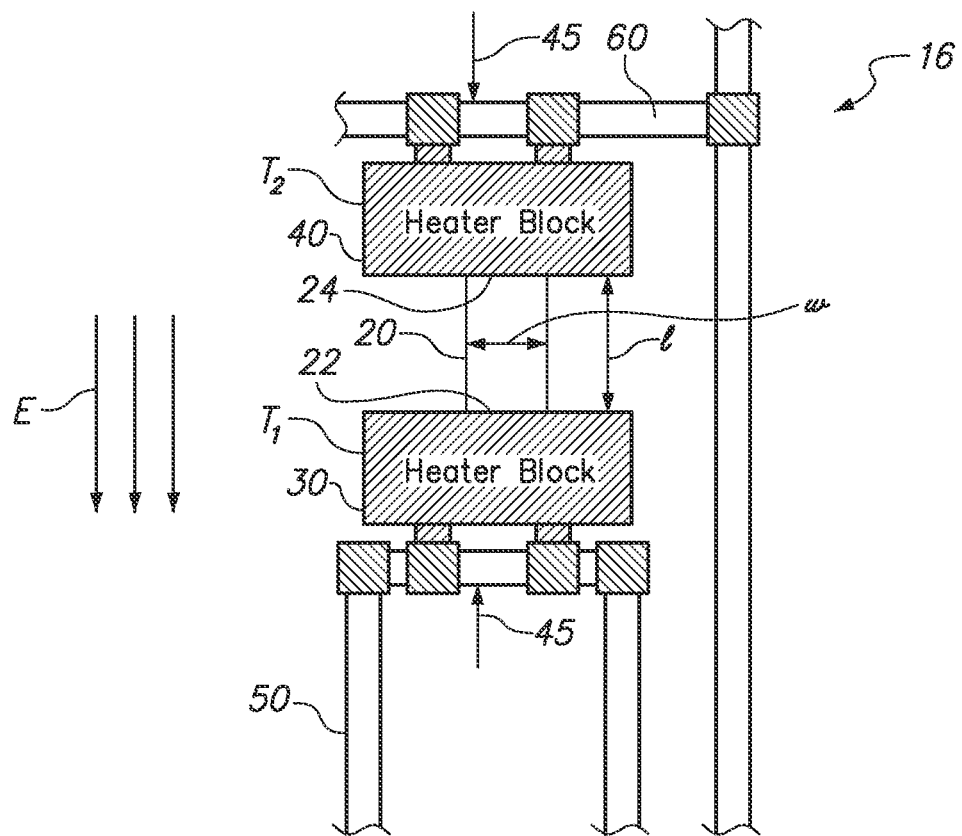
FIG. 2 is a front view of a schematic diagram of an embodiment of an apparatus of the present invention according to several embodiments.

Referring now to FIG. 2, a schematic diagram of an embodiment of an apparatus 16 employing a sample between two heat sources, in accordance with the present invention according to several embodiments is shown. As shown, apparatus 16 can include a sample 20 in thermal contact with a first heat source 30 and a second heat source 40. In some embodiments, a first end 22 and second end 24 of sample 20 can be physically in contact with respective first and second heat sources 30 and 40. For the present invention, sample 20 can be held in place between heat sources 30 and 40, and an uniaxial compressive pressure can be applied, as indicated by arrows 45 in FIG. 2. This pressure may be applied manually, with supports 50 and 60 being adjusted by being urged toward each other, and then held fixed via set-screws or a similar locking mechanism. Alternatively, supports 50 and 60 can have their position controlled via a threaded rod, ratchet, hydraulic, or similar type assembly so that the pressure can be controllably applied to sample 20 in a repeatable manner. In several embodiments, and as discussed more fully below, and electric field E can be applied in the same direction as the uniaxial pressure.

Sample 20 can be a sample of a chemical compound and may comprise any size or shape of substrate 26 and film 28. Examples of film 28 can include $YBa_2Cu_3O_{7-x}$ and similar oxide compounds having an initial uniform oxygen content, fluorine doped Fe—As superconducting compounds and similar compounds, pure metal or metallic alloys with diffusive hydrogen, optical materials annealed in a reactive gas, or any such chemical compound that exhibits useful changes in physical properties upon undergoing an annealing process. Substrate 26 can be a $SrTiO_3$ material.

For instance, in the case where sample 20 is a cuprate superconductor single crystal or film, the sample may initially be prepared with either a uniform high (maximum) or low (minimum) oxygen content. For example, using $YBa_2Cu_3O_x$, the oxygen content, x, can be between 6 or 7, where 6 is low and 7 is high. The low/high criterion is determined by the minimum/maximum amount of oxygen (diffusive molecule) that the parent/host compound can reversibly uptake or expel without undergoing an irreversible chemical breakdown into new stoichiometric compounds.

Heat source 30 can be set to a first temperature $T_1$ and heat source 40 can be set to a second temperature $T_2$. The difference in temperatures between heat source 30 and heat source 40 may depend upon various factors such as the composition of the sample material, the desired gradient for the sample material, and the gas and pressure used in the atmospheric chamber. In some embodiments, the first temperature $T_1$ is a temperature above a characteristic thermal activation temperature of the sample at which at least some of the diffusive atomic constituents, such as oxygen, nitrogen, and hydrogen are able to diffusively move in and out of the parent material, such as $YBa_2Cu_3O_{7-x}$, yttrium stabilized zirconia, and tantalum or palladium, respectively, in a gaseous phase, while the second temperature is a temperature below this characteristic thermal activation temperature. Such temperatures are known to those having ordinary skill in the art and are readily available in the literature. As an example, heat sources 30 and 40 may be heater blocks. In some embodiments, the temperatures of heat sources 30 and 40 may be set and variably controlled using temperature controllers (not shown) connected thereto. In still other embodiments, the first temperature can be less than 350 degree Centigrade, and the second temperature can be greater than 375 degrees Centigrade. For the embodiments shown in the Figures, $T_1$ can be 295° C., $T_2$ can be 395° C., length "l" of sample 20 can be 10 mm, and width "w" of sample can be 5 mm.

Heat source 30 can be secured to a support 50 and heat source 40 can be secured to a support 60, such that heat source 40 is positioned directly above and separated from heat source 30. In other embodiments, heat source 40 and heat source 50 may be oriented differently with respect to one another. As an example, supports 50 and 60 may comprise adjustable stainless steel frames. However, other configurations and materials may be used for supports 50 and 60 as would be recognized by one having ordinary skill in the art.

Figure 3:
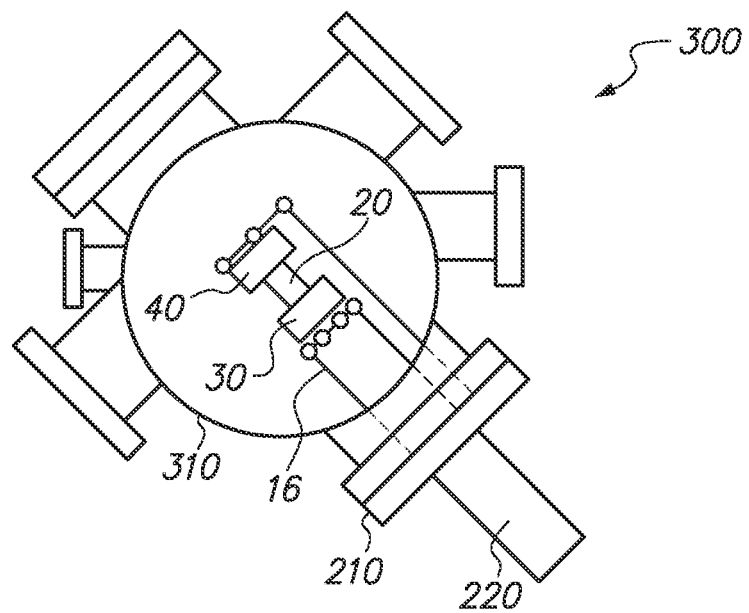
FIG. 3 is a top plan view of the apparatus of FIG. 2, when positioned within an atmospheric/vacuum chamber.

Referring to FIG. 3, a top view of a schematic diagram 300 of an embodiment of an apparatus 16 positioned within an atmospheric chamber is shown. As an example, apparatus 16 can be contained within atmospheric chamber 310. Atmospheric chamber 310, an example of which is a vacuum chamber, may be pressure controlled and may be filled with a reactive or inert gas. The pressure that atmospheric chamber 310 is set to may depend on the composition of the sample material, the desired gradient for the sample material, the gas used in the atmospheric chamber, and the temperature of the heat source(s). In several embodiments, the partial oxygen partial pressure can be established on the surface of the sample 20. For example, in the case of $YBa_2Cu_3O_x$, the sample 20 can be initially annealed in a 950 Torr oxygen atmosphere at 450° C. The sample is then placed in the thermal gradient apparatus with a heat source and heat sink. The oxygen atmosphere is set to a low pressure (e.g. 100 mTorr), the heat source 30 can be set to $T_1$ and heat source 40 can be set to $T_2$, and a thermal gradient equilibrium is established so that the heat sink is stable. Apparatus 16 may be thermally well connected to atmospheric chamber 310 via a high vacuum flange 210 connected to the heater block assembly 220. The flange may have electrical feed-throughs for connecting the controls of one or two heater blocks.

The substrate 26 and film 28 can held at an elevated, but physically varying steady state temperature, i.e., a thermal gradient is established along the direction of the applied pressure. In addition, the film is also held in an oxygen environment conducive to high levels of rapid oxygen mobility along the direction of the applied pressure and thermal gradient, i.e., the oxygen pressure is low enough to reduce the oxygen content in the sample at the high temperature end to 7-x≈6.66. Under these conditions, a monotonic physical variation in oxygen content can be established along the length of the sample. The process is described more fully in U.S. application Ser. No. 13/001,351, filed May 23, 2013, and entitled "Apparatus And Method For Producing A Sample Having A Monotonic Doping Gradient Of A Diffusive Constituent Or Interstitial Atom Or Molecule". The '351 application is assigned to the same assignee as the present invention, and is hereby incorporated by reference herein in its entirety. With the application of uniaxial pressure 45 (See FIG. 2) to the sample 20 simultaneously with the annealing process, the a-axis (See FIG. 1) can then be preferentially aligned parallel to the direction of applied pressure.

Variations of the annealing apparatus as described herein can include more advanced methods to apply a controlled amount of uniaxial pressure. In the case discussed here, the pressure was applied manually, with the movable stage(s) pushed into place and then held fixed via set-screws. Alternatively, the application of pressure can be controlled wherein the position of the movable heater/heat sink stage(s) are controlled via a threaded rod, ratchet, hydraulic, or similar type assembly in a repeatable manner by which the absolute value of the pressure can be determined.

From a comparison/correlation of the evolution of the lattice structure, magnetic properties, and electronic transport properties of the film along the physical direction corresponding to the thermal/oxygen gradient and applied uniaxial pressure a conclusion can be supported wherein the a-axis has aligned along the same direction as the direction of the applied pressure. Specifically, there is a suppression of the value of $T_c$, as determined from resistivity measurements, which can be further inferred from x-ray diffraction measurements. Stated differently, values of the c-axis lattice parameter at various positions along the 1 cm length of the sample can be calculated from a series of <00l> peaks obtained from θ-2θ measurements focused on small areas of the sample. From the c-axis lattice length, values of $T_c$ can be determined as known in the prior art (Please see R. Liang et al., Phys. Rev. B73, 18505(R) (2006). This is discussed in more detail below, when referring to FIG. 4.

Figure 4:
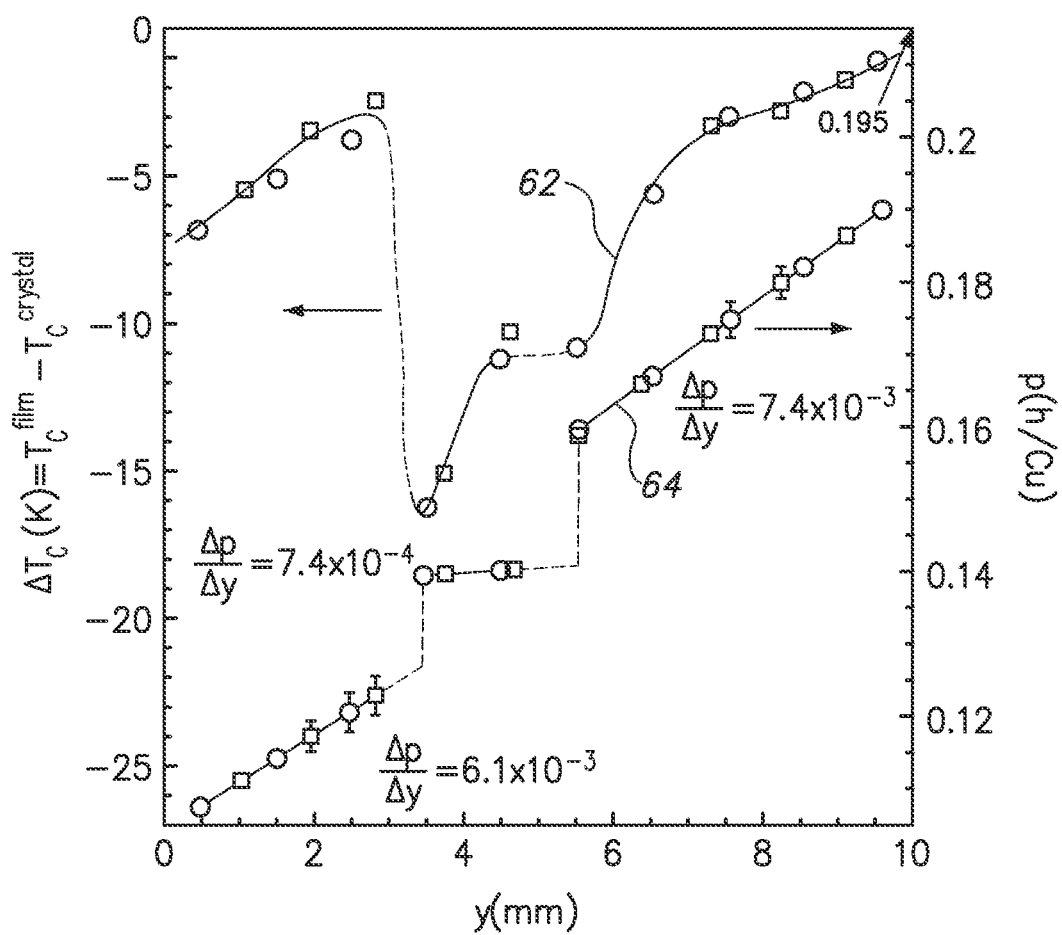
FIG. 4 is a graph illustrating the difference in the critical temperature between the resistively determined value and that calculated for a single crystal having the same c-axis length, i.e., $\Delta T_c$ vs. sample position y (mm) and hole concentration p versus sample position y (mm) for the sample of FIG. 2.

After patterning the films 28 with resistance paths having constant values of oxygen content, i.e., along the direction perpendicular to the thermal/oxygen gradient, resistivity vs. temperature, ρ(T), measurements can be taken along the length of the sample, as a function of sample position. A comparison of the two sets of $T_c$ values as a function along the sample length reveal a suppression of $T_c$ from that observed for high purity single crystals. This is shown in FIG. 4. Stated differently, FIG. 4 illustrated the difference in $T_c$ between the resistively determined value (curve 62) and the $T_c$ that can be calculated for a single crystal from the c-axis length. This $\Delta T_c$ vs. sample position y (mm) and hole concentration p versus sample position y (mm) for the sample of FIG. 2 can be seen in FIG. 4.

FIG. 4 can be interpreted to illustrate a maximum of suppression in the region where the oxygen content gives a hole doping level of p≈1/7. This value of p corresponds to a fully ordered chain state as known in the prior art, where four fifths of the Cu(1)-O chains are full and the remaining chain is empty. In addition to the observed suppression of $T_c$, linear fits to the average of the c-axis length determined from the two sets of peaks reveal three distinct regions of oxygen mobility. As shown in FIG. 4, in the regions from y≈0.5 mm-3.0 mm and y≈5.0 mm-10 mm (where the substrate y-axis is along the oxygen gradient) the change in hole concentration per sample length is $\Delta p/\Delta y \approx 4.6 \times 10^{-3}$ (holes/Cu)/mm (analogous to approximately 37 Volts per meter) and $9.2 \times 10^{-3}$ (holes/Cu)/mm, respectively (which can be converted to approximately 45 volts per meter). The electric field E in FIG. 1 would need to be greater than this value. As shown in FIG. 4, the intermediate region, near p=1/7, exhibits negligible variance in $\Delta p/\Delta y$.

Figure 5:
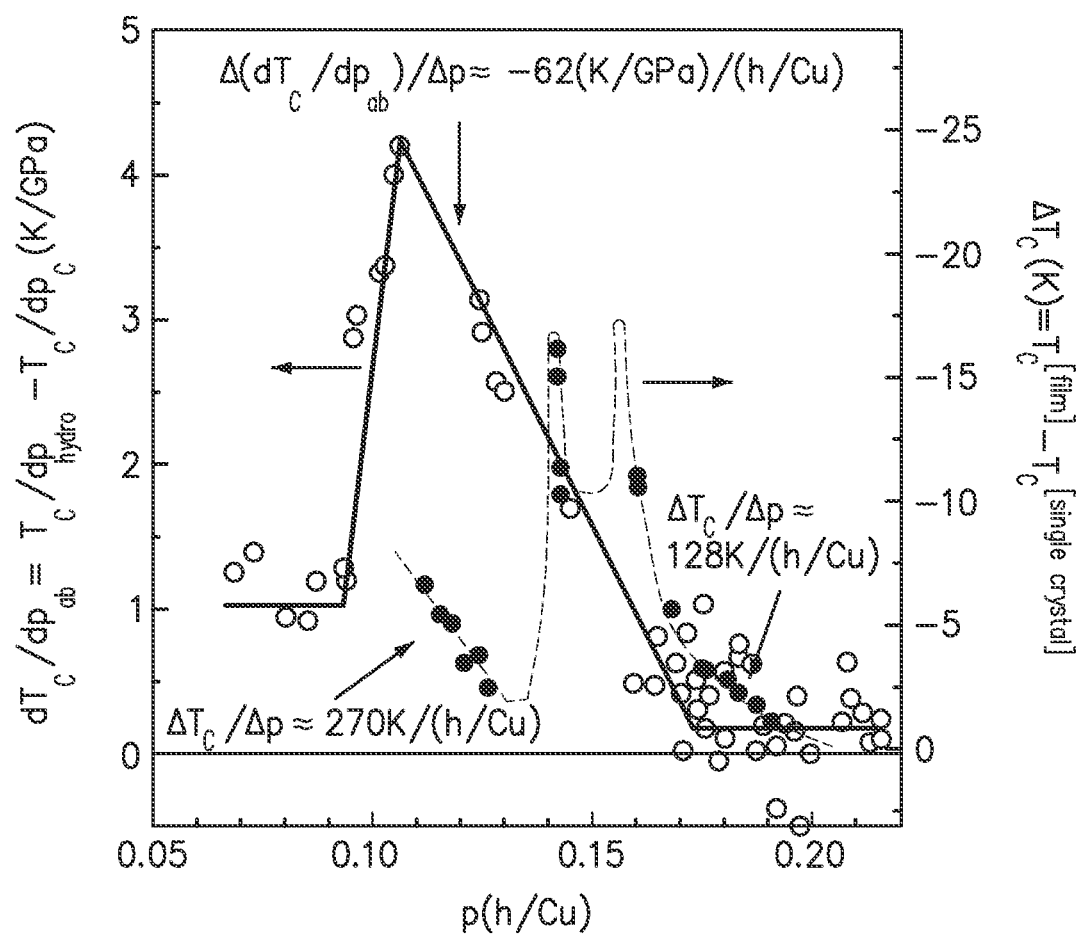
FIG. 5 is a graph illustrating a comparison of the hole concentration p versus the change of $T_c$ for single crystals due to uniform in-plane pressure (left axis) to the difference between the values of $T_c$ of the $YBa_2Cu_3O_{7-x}$ film and that of unstrained single crystals with the same oxygen content (right axis)

FIG. 5 can illustrate a comparison of the charge doping dependence of the change of $T_c$ for single crystals due to in-plane pressure to the difference between the values of $T_c$ of the $YBa_2Cu_3O_{\nabla x}$ film and unstrained single crystals. The $dT_c/dp_{ab}$ vs p data (open circles) are deduced values for compressive in-plane (a-b) pressure applied to single crystals of $YBa_2Cu_3O_x$. The single crystal data, along with the linear guide lines, are reproduced from Fietz et al. Values of $\Delta T_c$ vs. p (closed circles) for the strained $YBa_2Cu_3O_{\nabla x}$ film are determined from the difference between the resistively measured values of $T_c$ and that determined from the single crystal data of Liang et al. The short dashed line is speculative as to the strain effects at the boundary between the p=1/7 and p=1/6 regions. Note the sign reversal used for the (right) $\Delta T_c$ axis. A negative impact on $T_c$ is consistent with compressive/expansive strain along the a/b-axis direction.

For several embodiments, the sample (single crystal $SrTiO_3$ substrate and 1300 nm thick YBCO film) was placed under an estimated pressure of P≈4.5 MPa simultaneously with the application of the thermal gradient. The temperature distribution across the sample can be from 290° C. to 395° C. These conditions are very similar to what is reported in the prior art for the de-twinning of YBCO single crystals. With the pressure along the length of the sample, then the preferential orientation is for the a-axis to align with the pressure/thermal gradient. This means the (b-axis) Cu—O chains are aligned along the perpendicular direction. It is known that oxygen diffuses in both the a- and b-axis directions, though much more readily along the b-axis.

The above results (see FIG. 4) support a conclusion that: (1) Above p≈1/6, oxygen diffuses normally in both a- and b-axis directions; (2) In the region of p≈1/7 (ordered chain state) oxygen moves almost exclusively along the direction parallel to the Cu—O chains—so much so that it produces a strong barrier to diffusion across the (rather wide) region where it has formed—and it tends to stabilize this doping/structural configuration at the expense of the adjacent doping levels 1/8<p<1/6 and, (3) Below p≈1/8, oxygen moves in both a- and b-axis directions, however even more freely in the a-axis direction as it does in case (1) above. Finally, the nearly discontinuous evolution of the c-axis lattice parameter/hole doping level at the boundaries of the p≈1/7 region, produces a tremendous amount of strain in the crystal structure along the a-axis at these boundaries, which subsequently reduces $T_c$ further than the overall strain thought the film (see FIG. 5).

As noted above, in the prior art, it was found that in-plane compressive stress produced the greatest change in $T_c$ near 0.11 with a linear dependence of $dT_c/dp_{ab}$. However, in the prior art, it was found that the compressive stress produced an increase in $T_c$. Thus, it is likely that the same trend of a-axis suppression/b-axis enhancement of $T_c$ at optimal doping would follow at other doping levels, such as in the case of the present invention according to several embodiments. From the results shown in FIG. 5 we can conclude that the film is strained/compressed along the a-axis direction, which would imply that the film is mostly or completely untwinned. Additionally, because the 1300 nm film is much thicker than the critical thickness (~10 nm) strain due to lattice mismatch between film and the SrTiO3 (001) cut substrate is negligible, and, to the extent that such strain is present, it would be homogeneously distributed due to the cubic lattice structure of the substrate. It is postulated here, but not yet confirmed, that the successful de-twinning of the film is, (in addition to the application of uniaxial pressure at an elevated temperature), can be driven by either the physical process of the rapid bulk motion of oxygen along the thermal gradient and the resulting internal electric field gradients, or, by the inherent stability of the p≈1/7 doping state. More research in this regard can be warranted.

The combined evidence from x-ray diffraction, magnetization, and electronic transport measurements supports two possible conclusions: (1) That a-axis alignment (de-twinning) is most complete in the region of the sample where p≈1/7; or, (2) That a-axis/b-axis alignment is uniform, but the induced a-axis lattice strain is strongest in the region where p≈1/7.

In either case, following the combination of applied pressure, thermal gradient, and oxygen reduction, as described above, the sample requires additional annealing steps to produce a uniformly oxygen doped mono-crystalline film. Once the oxygen gradient is established, then the sample, still under uniaxial pressure, is heated uniformly to the higher temperature of the thermal gradient previously established. If case (1) above holds, then the temperature of the sample can be set uniformly to $T_2$, and the partial pressure of the oxygen atmosphere is set so that the film is then uniformly reduced to p≈1/7, to complete the de twinning process. Subsequently the oxygen pressure and (uniform) sample temperature are set to levels conducive to the final desired oxygen content as described in the prior art. If case (2) above holds, then it is sufficient to set the oxygen pressure and (uniform) sample temperature to the levels appropriate to the final desired oxygen content. Once the film is completely de-twinned, the sample temperature is slowly reduced to ambient, the sample is removed from the annealing chamber, and the pressure is removed.

If, as surmised above, the internal electric field is responsible for locking in the detwinned state after the removal of the elevated temperature and applied uniaxial pressure, then a third option for producing untwinned YBCO films is possible, and may be necessary. Under this configuration a uniformly doped YBCO film sample is heated uniformly and is placed in an applied electric field that is oriented along the direction of the applied pressure. After sufficient annealing time to de twin the film, the sample is then cooled in the electric field and then the pressure is released. The ferroelastic properties of YBCO combined with the annealing process described here are expected to maintain the twin free structure of the YBCO film.

By using the apparatus and/or variants described herein and in the '351 application and the annealing method described above, it is possible to produce YBCO based HTS electronic systems with optimal electronic transport performance characteristics, and to potentially exploit tunnel junction circuitry utilizing the differences in electronic transport along the a-axis and b-axis, in particular, the difference in the magnitude of the superconducting gap along these direction, as well as at angles in between.

Results from a film of $YBa_2Cu_3O_7$ annealed using the as described apparatus are shown in FIG. 4. The film 28 was grown on a 5 mm×10 mm×1 mm SrTiO3 substrate 26. The substrate 26 was placed with the long dimension (y-axis) along the thermal gradient. The left axis of FIG. 4 can show the difference in $T_c$ between the resistively measured value of the critical temperature $T_c$, and that calculated from the length of the crystal lattice c-axis as determined by x-ray diffraction data via the relationships established in Liang et al. It is readily observed that the maximum observed suppression of $T_c$ occurs near p=⅐. The right axis of FIG. 4 shows the values of the hole doping level p as a function of position along the length of the sample as also determined from the x-ray data.

Figure 6:
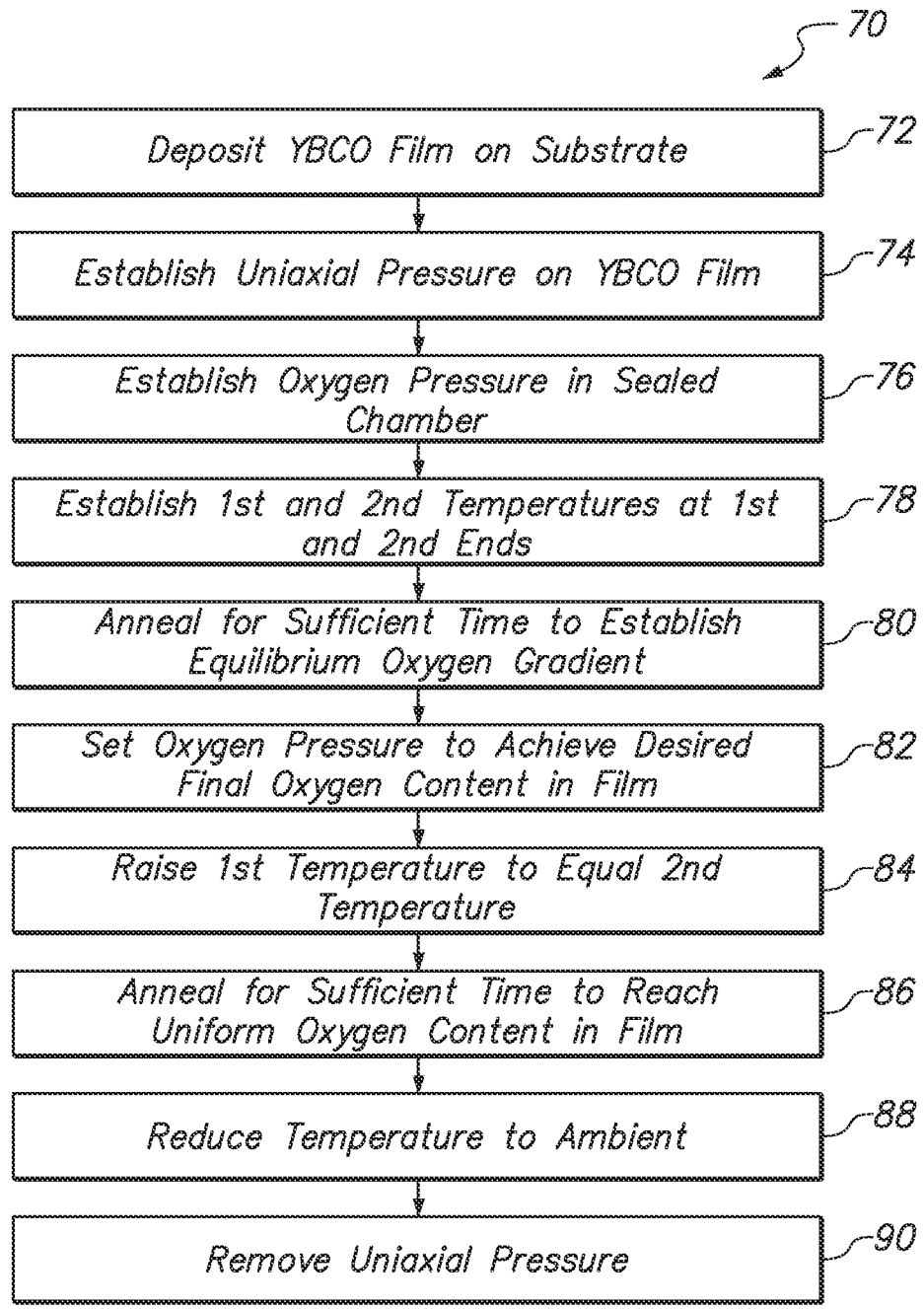
FIG. 6 is a block diagram of steps that can be taken to practice the methods of the present invention according to several embodiments; and, FIG. 7 is a block diagram of steps that can be taken to practice the methods of the present invention according to several alternative embodiments

Referring now to FIG. 6, a block diagram which shows steps that can be taken to practice the methods of the present invention is shown and generally designated by reference character 70. As shown, method 70 can include the initial step 72 of depositing a YBCO film 26 having an initial uniform oxygen content on a substrate 28. This step can establish the aforementioned sample 20, which can further be placed in atmospheric chamber 310 (also described above) for further processing. Next, and as indicated by block 74, a uniaxial pressure can be established on the YBCO film, and a partial oxygen pressure can be established on the sample, as indicated by block 76. The sample 20 can be annealed by establishing a first temperature and a second temperature and respective first and second ends 22, 24 of sample 20, which can establish temperature gradient in film 26 (which further establishes an oxygen gradient in YBCO film 26 as described above). This is indicated by blocks 78 and 80 in FIG. 6.

The simultaneously application of steps 74 and 76 can result in a detwinned YBCO film, which can further be used for the applications as described above. The methods can also include the step of setting the oxygen pressure to achieve the desired final oxygen content in the YBCO film, as indicated by step 80 in FIG. 6.

Several of the embodiments described above discuss the production of a mostly or completely twin-free film of YBCO having a monotonic oxygen gradient distribution. However, and referring again to FIG. 6, the methods of other embodiments can be extended to produce a twin-free YBCO film having a uniform oxygen content as well. To do this, a uniform temperature can be established in sample 20 by raising first temperature $T_1$ so that it is substantially equal to second temperature $T_2$, as indicated by block 84 in FIG. 6. Step 84 can also be accomplished simultaneously with the accomplished of steps 74 and 76. The sample can then be annealed for sufficient time to reach a uniform oxygen content in the film (block 86). Next, the temperature to the sample can be reduced to ambient temperature, as indicated by block 88 in FIG. 6. Once at ambient, the uniaxial pressure can be removed, as indicated by block 90 in FIG. 6.

Figure 7:
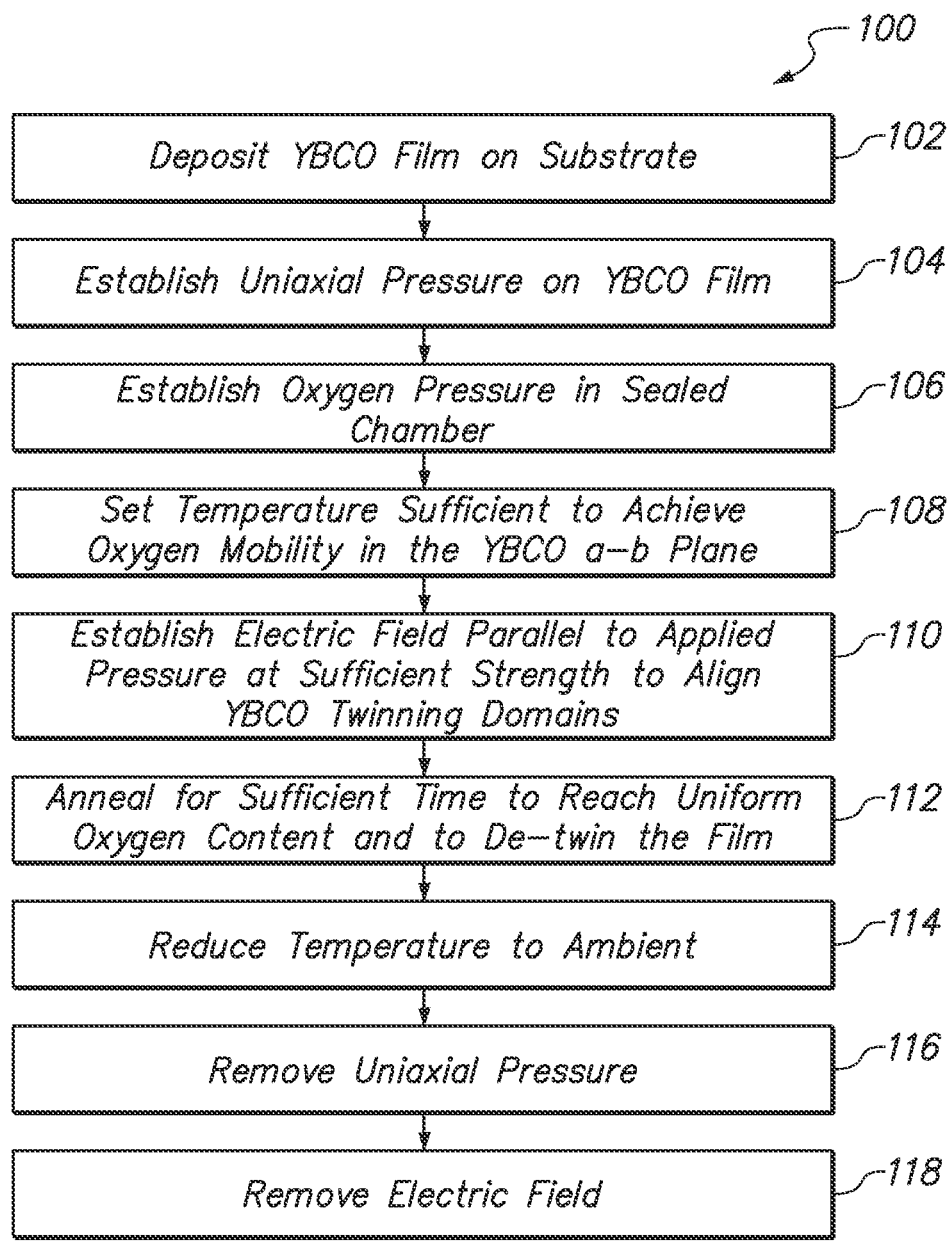

Referring now to FIG. 7, a block diagram which shows steps that can be taken to practice the methods of the present invention according to several embodiments is shown and generally designated by reference character 100. As shown, method 100 can include the initial step 1022 of depositing a YBCO film 28 having an initial uniform oxygen content on a substrate 28. This step can establish the aforementioned sample 20, which can further be placed in atmospheric chamber 310 (also described above) for further processing. Next, and as indicated by block 104, a uniaxial pressure can be established on the YBCO film, and a desired oxygen pressure can be established on the sample 20, as indicated by block 106. A temperature that is sufficient to achieve oxygen mobility in the YBCO a-b plane can be imposed on the sample, as indicated by step 108. Further an electric field E can be established parallel to the direction of uniaxial pressure (see also FIG. 1), in order to align the YBCO twinning domains, as indicated by step 110. A field strength of at least 37 volts per meter can be used, but other field strengths could also be used.

The sample can then be annealed for sufficient time to reach uniform oxygen content in the YBCO film, as indicated by block 112 in FIG. 7. Next, the temperature of the sample can be reduced to ambient temperature, as indicated by block 114 in FIG. 7. Once at ambient, the uniaxial pressure can be removed, as indicated by block 116, and the electric field can be removed, as indicated by step 118 in FIG. 7.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for manufacturing untwinned YBCO film, said method comprising the steps of:
   A) depositing a YBCO film having an initial uniform oxygen content on a substrate so that said YBCO film has a first end and a second end;
   B) exerting a uniaxial pressure on said film from said first end to said second end;
   C) supplying a desired oxygen partial pressure on said YBCO film; and,
   D) establishing a first temperature at said first end and a second temperature at said second end, said first temperature being lower than said second temperature to establish an oxygen gradient in said film, said step D) being accomplished simultaneously with said step B) and step C) so that said YBCO film remains untwinned at the completion of said step D).

2. The method of claim 1, wherein said step D) is accomplished by placing said first end in contact with a first heat source at said first temperature, and by placing said second end in contact with a second heat source at said second temperature.

3. The method of claim 2, wherein first temperature is less than 350 degrees Centigrade.

4. The method of claim 2, wherein said second temperature is greater than 375 degrees Centigrade.

5. The method of claim 1, wherein said step B) is accomplished by urging said first heat source towards said second heat source.

6. The method of claim 1, wherein said step A), said step B), said step C) and said step D) are accomplished inside a pressure controlled atmospheric chamber.

7. The method of claim 1, further comprising the steps of:
   E) raising said first temperature to substantially equal said second temperature to establish a uniform film temperature for said YBCO film, said step E) being accomplished after the establishment of said oxygen gradient and during the accomplishment of said step D);
   F) reducing said first temperature to ambient; and,
   G) removing said pressure.

8. The method of claim 1, wherein said uniaxial pressure is at least 4.5 MPa.

* * * * *